United States Patent [19]
Asai et al.

[11] Patent Number: 5,869,872
[45] Date of Patent: *Feb. 9, 1999

[54] SEMICONDUCTOR INTEGRATED CIRCUIT DEVICE AND MANUFACTURING METHOD FOR THE SAME

[75] Inventors: Akiyoshi Asai, Aichi-gun; Jun Sakakibara, Anjo; Megumi Suzuki, Toyota; Seiji Fujino, Toyota, all of Japan

[73] Assignee: Nippondenso Co., Ltd., Kariya, Japan

[*] Notice: This patent issued on a continued prosecution application filed under 37 CFR 1.53(d), and is subject to the twenty year patent term provisions of 35 U.S.C. 154(a)(2).

[21] Appl. No.: 974,700

[22] Filed: Nov. 19, 1997

Related U.S. Application Data

[63] Continuation of Ser. No. 678,473, Jul. 9, 1996, abandoned.

[30] Foreign Application Priority Data

Jul. 10, 1995 [JP] Japan ................................ 7-173769
Feb. 27, 1996 [JP] Japan ................................ 8-039953

[51] Int. Cl.⁶ ..................... H01L 23/62; H01L 27/76; H01L 27/01; H01L 27/12
[52] U.S. Cl. ..................... 257/360; 257/345; 257/349; 257/35.1; 257/358; 257/361; 257/394
[58] Field of Search ..................... 257/345, 347, 257/349, 351, 358, 360, 361, 394

[56] References Cited

U.S. PATENT DOCUMENTS

| | | |
|---|---|---|
| 5,262,664 | 11/1993 | Jung-Suk ................................ 257/345 |
| 5,268,317 | 12/1993 | Schwalke et al. . |
| 5,352,914 | 10/1994 | Fab ................................ 257/345 |
| 5,514,902 | 5/1996 | Kawasaki et al. ................................ 257/345 |

FOREIGN PATENT DOCUMENTS

| | | |
|---|---|---|
| 1-278778 | 11/1989 | Japan . |
| 4-101432 | 4/1992 | Japan . |
| 4-345064 | 12/1992 | Japan . |
| 5-114730 | 5/1993 | Japan . |
| 5-291287 | 11/1993 | Japan . |
| 5-343668 | 12/1993 | Japan . |
| 6-005797 | 1/1994 | Japan . |
| 6-267881 | 9/1994 | Japan . |
| 6-291077 | 10/1994 | Japan . |

*Primary Examiner*—Ngan V. Ngo
*Attorney, Agent, or Firm*—Pillsbury Madison & Sutro LLP

[57] ABSTRACT

A semiconductor integrated circuit device having an SOI structure is capable of preventing occurrence of leak current flowing from a diffusion layer even when a semiconductor element having a pn-junction is included in the semiconductor substrate. The semiconductor integrated circuit device having the SOI structure is formed with a semiconductor layer, or SOI layer, on a p-type semiconductor substrate through a buried insulating film and further with semiconductor circuit elements serving as functional elements at the SOI layer thus formed. As a protection transistor to protect the semiconductor circuit elements, a MOSFET may be formed in which n-type diffusion layers are formed in the semiconductor substrate. The n-type diffusion layers of the MOSFET are to be surrounded by p-type diffusion layers more highly doped than the semiconductor substrate.

12 Claims, 7 Drawing Sheets

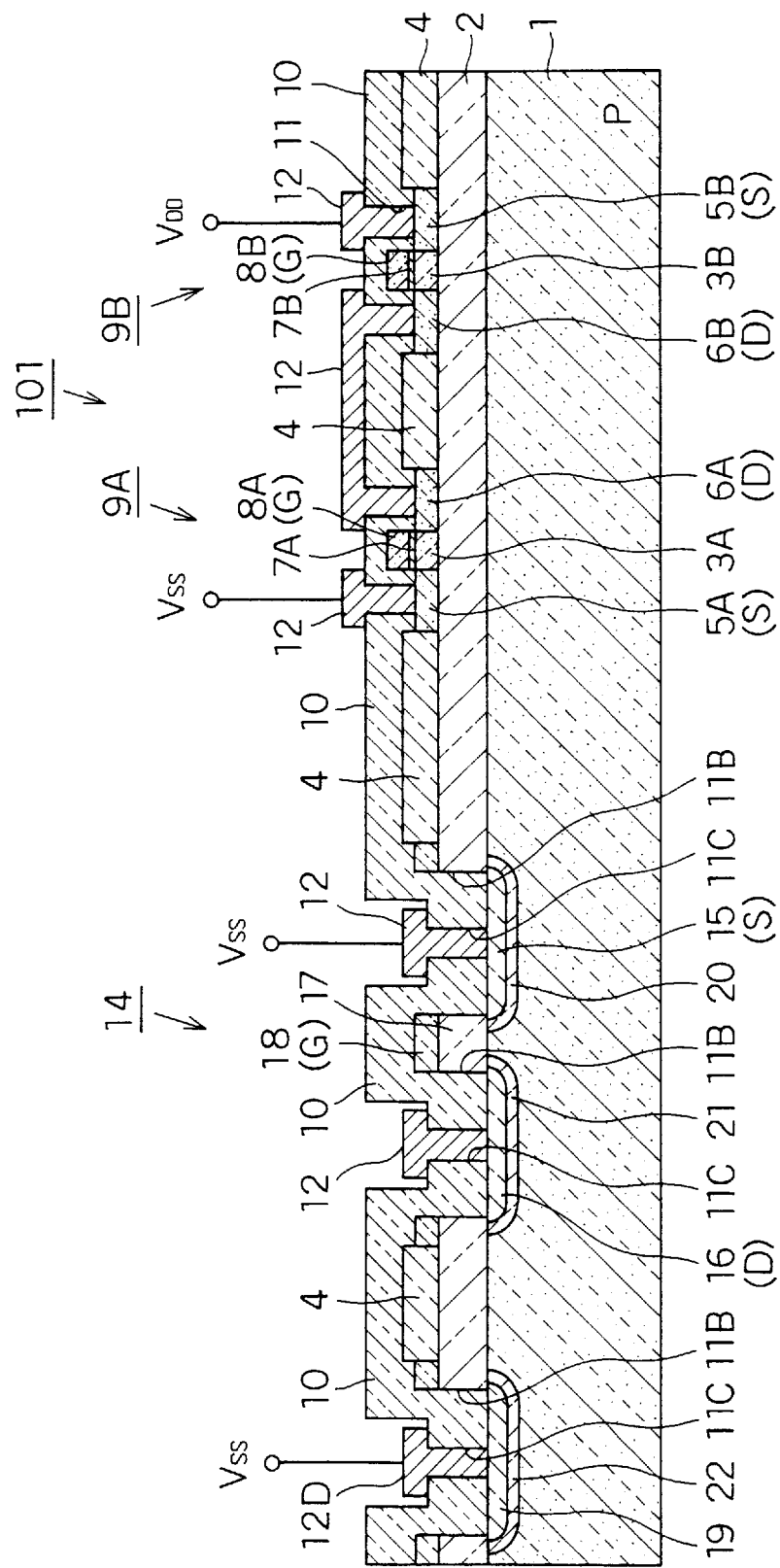

ns 12 made of, e.g., aluminum (Al) alloy are formed as to
SEMICONDUCTOR INTEGRATED CIRCUIT DEVICE AND MANUFACTURING METHOD FOR THE SAME This is a continuation of application Ser. No. 08/678,473, filed on Jul. 9, 1996, which was abandoned.

CROSS-REFERENCE TO RELATED APPLICATIONS

The present application is related to and claims priority from Japanese Patent Application Nos. Hei 7-173,769 and Hei 8-39953, incorporated herein by reference.

BACKGROUND OF THE INVENTION

1. Field of the Invention

This invention relates to a semiconductor integrated circuit device and a manufacturing method for the same and, more particularly, to a semiconductor integrated circuit device having an SOI (silicon on insulator) structure to realize with electrical stability a structure formed together with a semiconductor element having a pn-junction in a semiconductor substrate and a manufacturing method for the same.

2. Description of Related Art

As is well-known, when formed with a semiconductor element at a silicon layer formed on a semiconductor substrate through an insulating film, or at an SOI layer, a semiconductor integrated circuit device can be built with reduced parasitic capacity of the elements, thereby improving its performance, such as high speed and low power consumption. Meanwhile, such a semiconductor integrated circuit device with the SOI structure may be required to be formed with a semiconductor element having a pn-junction in the semiconductor substrate. For example, Japanese Laid-Open Patent Publication No. Hei 4-345064 discloses an example in which a protection circuit element is formed in the semiconductor substrate to protect the semiconductor integrated circuit device when a high voltage is applied due to static electricity or like from the outside of the semiconductor integrated circuit device.

FIG. 7 shows a cross-sectional structure of the essential portion of the semiconductor integrated circuit device having such an SOI structure formed with a semiconductor element having a pn-junction in the semiconductor substrate. FIG. 8 shows an equivalent circuit of the semiconductor integrated circuit device shown in FIG. 7. With the semiconductor integrated circuit device shown in FIG. 7, a semiconductor substrate 1 is made of, e.g., a p-type silicon single-crystal substrate, on which a buried insulating film 2 made of, e.g., SiO$_2$ is formed. Single-crystal silicon layers isolated in a fashion to form islands, or SOI layers 3 (3A and 3B) are formed on the buried insulating film 2, thereby realizing the SOI structure as a semiconductor integrated circuit device. An isolating insulating film 4 made of, e.g., SiO$_2$ is formed around the SOI layers 3A, 3B when necessary.

In the semiconductor integrated circuit device, an n-channel MOSFET 9A is constituted at the SOI layer 3A by a source region 5A and a drain region 6A formed therein, a gate insulating film 7A formed on the SOI layer 3A, and a gate electrode 8A made of, e.g., polysilicon on the gate insulating film 7A. Similarly, a p-channel MOSFET 9B is constituted at the SOI layer 3B by a source region 5B and a drain region 6B, a gate insulating film 7B on the SOI layer 3B, and a gate electrode 8B on the gate insulating film 7B.

An interlayer insulating film 10 is formed on the SOI layers 3A, 3B and the isolating insulating film 4, and interconnections 12 made of, e.g., aluminum (Al) alloy are formed as to contact with the source regions 5, the drain regions 6, and the gate electrodes 8, though contacting portions are not shown, of the MOSFETs 9A, 9B, respectively, through contact holes 11 opened in the interlayer insulating film 10.

By means of the interconnections 12, the source region 5A of the n-channel MOSFET 9A is coupled to a ground line Vss, and the source region 5B of the p-channel MOSFET 9B is coupled to a power supply line Vdd. A CMOS inverter circuit 101 shown in FIG. 8 is constituted of the n-channel and p-channel MOSFETs 9A and 9B. It is to be noted that in the semiconductor integrated circuit device, as shown in FIG. 8, the CMOS inverter circuit 101 is used as an input circuit. Formed between a bonding pad 102 serving as a connecting terminal for an external device and the CMOS inverter circuit 101 is an input protection circuit 103 for protecting the CMOS inverter circuit 101. The input protection circuit 103 is constituted of a protection resistor 13 inserted serially between the bonding pad 102 and the CMOS inverter circuit 101 and a protection transistor 14 serially connected between the input of the CMOS inverter circuit 101 and the ground line Vss. As the protection transistor 14, e.g., an n-channel MOSFET is used.

Referring to FIG. 7, the structure of the protection transistor 14 constituted as the n-channel MOSFET is described. In the semiconductor integrated circuit device shown in FIG. 7, the protection transistor 14 is constituted of source and drain regions 15, 16 made of n-type diffusion layers formed in the p-type semiconductor substrate 1, a gate insulating film 17 formed on the semiconductor substrate 1, and a gate electrode 18 formed on the gate insulating film 17. The gate insulating film 17 is a part of the buried insulating film 2, and the gate electrode 18 is a part of the SOI layer 3. In the protection transistor 14 thus constituted, interconnections 12 made of, e.g., aluminum alloy are connected with the source and drain regions 15, 16 through contact holes 11C. The contact holes 11C are formed to open the interlayer insulating film 10 deposited so as to bury the substrate contact holes 11B formed to open the buried insulating film 2 (the gate insulating film 17) as well as the SOI layer 3 (the gate electrode 18). Another interconnection 12, though not shown, is also connected to the gate electrode 18 through the contact hole 11C formed to open the interlayer insulating film 10. Moreover, in the semiconductor integrated circuit device shown in FIG. 7, a highly doped p-type diffusion layer 19 is formed in the p-type semiconductor substrate 1. The p-type diffusion layer 19 is a diffusion layer for electrically coupling the semiconductor substrate 1 with an interconnection 12D, so that the semiconductor substrate 1 is connected to, e.g., the ground line Vss through the p-type diffusion layer 19 and the interconnection 12D. Thus, in the semiconductor integrated circuit device shown in FIGS. 7 and 8, the protection transistor 14 having a pn-junction in the semiconductor substrate 1 of the CMOS inverter circuit 101 is formed together with the SOI structure of the CMOS inverter circuit 101. Large current created due to static electricity can therefore be discharged to the semiconductor substrate 1 through the protection transistor 14, thereby preventing a large current from flowing directly into the CMOS inverter circuit 101. That is, the protection transistor 14 suitably prevents the CMOS inverter circuit 101 from being impaired or destroyed.

As described above, with the semiconductor integrated circuit device having the SOI structure, a semiconductor element having a pn-junction in the semiconductor substrate for protection of, e.g., other integrated circuit elements may be formed together with the SOI structure. With such a structure formed together with a semiconductor element having a pn-junction in the semiconductor substrate, however, it has been discovered by the inventor(s) that leak current may occur, e.g., between the n+ type diffusion layer and the p+-type diffusion layer or n+-type diffusion layer formed in the p-type semiconductor substrate.

That is, with the semiconductor integrated circuit device exemplified in FIG. 7, when a positive voltage with respect to the semiconductor substrate 1 is applied to the drain region 16 of the n-channel MOSFET constituting the protection transistor 14, leak current L1 or L2 as shown by arrows may occur around the interface between the semiconductor substrate 1 and the buried insulating film 2 (gate insulating film 17). Specifically, the leak current L1 flowing from the drain region 16 to the source region 17 is a current generated due to a low threshold voltage of the protection transistor 14 (which is turned into a depletion-type transistor). Even though the voltage applied to the gate electrode 18 is, e.g., zero volts, a channel is formed at the surface portion of the semiconductor substrate 1 between the drain and source regions 16, 15, thereby permitting the current L1 to flow. On the other hand, the leak current L2 flowing from the drain region 16 to the p-type diffusion layer 19 is a current generated due to formation of a depletion layer around the surface of the semiconductor substrate 1.

At any rate, when the leak current L1 or L2 thus occurs, even off-characteristics of the n-channel MOSFET constituting the protection transistor 14 are impaired significantly. Signal voltage from the outside leaked into other terminals through such elements may invite inconveniences such that normal signals are not transmitted to internal integrated circuit elements or that power consumption as a semiconductor integrated circuit device increases. It is to be noted that boron as p-type impurity tends to be absorbed in the $SiO_2$ layer as the buried insulating film 2 from the silicon layer as the semiconductor substrate 1 by thermal treatment. Therefore, particularly when a p-type substrate is used as the semiconductor substrate 1, the impurity concentration is easily lowered around the interface between the semiconductor substrate 1 and the buried insulating film 2, thereby revealing such problems.

SUMMARY OF THE INVENTION

In view of the above problems of the prior art, it is an object of the present invention to provide a semiconductor integrated circuit device having an SOI structure that can eliminate leak current flowing from a diffusion layer even where a semiconductor element having a pn-junction in a semiconductor substrate is formed together with the SOI structure, and a manufacturing method for the same.

It is another object of the invention to provide a semiconductor integrated circuit device having a structure that can suitably prevent impurity concentration from being lowered around the interface of the semiconductor substrate to the buried insulating film.

According to a first aspect of the present invention, the above objects are achieved by providing a semiconductor device having a first conductivity type diffusion layer more highly doped than the semiconductor substrate is located between a second conductivity type diffusion layer of a second semiconductor circuit element and a first conductivity type semiconductor substrate or another second conductivity type diffusion layer, thereby suitably suppressing formation of any depletion layer at the surface portion of the semiconductor substrate and the channel as described above.

That is, according to this aspect of the invention, even where a semiconductor element having a pn-junction in the semiconductor substrate is formed together with the SOI structure in the semiconductor integrated circuit device having the SOI structure, any route of leak current generated around the interface of the semiconductor integrated circuit device to the insulating film is cut off, so that the structure thus formed is a semiconductor integrated circuit device with extreme electrical stability. In a preferred embodiment, it is particularly advantageous that the first conductivity type is p-type and the second conductivity type is n-type.

A MOSFET having the second conductivity type diffusion layers as the source and drain regions, a diode in which the first and second conductivity type diffusion layers constitute a pn-junction, a semiconductor circuit element formed with a pn-junction in the semiconductor substrate or the like is employed as the second semiconductor circuit element.

According to such a structure, no channel is formed in the first conductivity type diffusion layer highly doped more than the semiconductor substrate (i.e., if it is a transistor, it becomes an enhancement-type transistor) as described above. Therefore, leak current or the like is never generated between the source and drain regions even where the element is formed as the MOSFET. The first conductivity type diffusion layer highly doped more than the semiconductor substrate can suitably suppress formation of any depletion layer at the surface portion of the substrate. Therefore, no leak current is generated between those diffusion layers even where the second semiconductor circuit element is a diode around which a first conductivity type other diffusion layer is formed.

According to another aspect of the invention, a first conductivity diffusion layer of the second semiconductor circuit element is surrounded by a second conductivity type diffusion layer. According to this structure, the first conductivity type semiconductor substrate and the first conductivity type diffusion layer of the second semiconductor circuit element are electrically in contact with each other through the second conductivity type diffusion layer. Since the second conductivity type diffusion layer is located between the semiconductor substrate and the first conductivity type diffusion layer of the second semiconductor circuit element, formation of a channel at the surface of the semiconductor substrate or formation of a depletion layer as described above can be suitably suppressed while still providing the above-described effects. Accordingly, with such constitution, even where a semiconductor element having a pn-junction in the semiconductor substrate is formed together with the SOI structure in the semiconductor integrated circuit device having the SOI structure, any route of leak current generated around the interface of the semiconductor integrated circuit device to the insulating film is cut off. Preferably, the first conductivity type is n-type and the second conductivity type is p-type.

A MOSFET having the first conductivity type diffusion layers as the source and drain regions, a diode in which the first and second conductivity type diffusion layers constitute a pn-junction, or a semiconductor circuit element formed with a pn-junction in the semiconductor substrate or the like is employed as the second semiconductor circuit element. Occurrence of leak current is suitably suppressed in substantially the same manner as above even where the second semiconductor element is the MOSFET or the diode.

The second semiconductor circuit element mentioned above can be a protection circuit element electrically coupled to the first semiconductor circuit element for protecting the first semiconductor circuit element. Since it has an electrically stable structure, the second semiconductor circuit element can effectively protect the first semiconductor circuit element serving as a main circuit of the semiconductor integrated circuit device and prevent the first semiconductor circuit element from being impaired or destroyed.

The above objects are achieved according to still another aspect of the present invention by providing a method of manufacturing a semiconductor device having a first conductivity type diffusion layer highly doped more than a semiconductor substrate which includes the steps of opening substrate exposing holes reaching the semiconductor substrate through a semiconductor layer and an insulating layer, and introducing impurities for forming the first conductivity diffusion layer of a second semiconductor circuit element in a self-aligned manner with the same mask pattern. By using this method, the first conductivity type diffusion layer for preventing formation of any channel at the surface portion of the semiconductor substrate and formation of any depletion layer can be formed effectively and extremely stably with the opened substrate exposing holes. That is, although it is very important for the first conductivity type diffusion layer to be formed at a precise size so that it surrounds the second conductivity diffusion layer, this method makes mask alignment to the portions unnecessary and further ensures the required precision can be maintained. Introduction of such impurities can be conducted by ion implantations. By the ion implantations, not only the first conductivity type diffusion layer but also the second conductivity type diffusion layer which is formed thereafter to be surrounded by the first conductivity type diffusion layer are formed readily. Moreover, regarding the ion implantations, a method in which impurities are implanted with an angle of 10 degrees or more with respect to the perpendicular direction of the major surface of the semiconductor substrate is effective. The threshold voltage of the second semiconductor circuit element can be made higher by ion implantations in a manner thus described, even if the amount of doped ions calculated on the area basis of a face parallel to the surface of the semiconductor substrate is identical.

To fabricate the semiconductor integrated circuit device in which the first conductivity type diffusion layer is surrounded by the second conductivity type diffusion layer, it is effective to implement the steps of opening substrate exposing holes reaching the semiconductor substrate in the semiconductor layer and the insulating layer and introducing impurities for forming the second conductivity diffusion layer of the second semiconductor circuit element in a self-aligned manner with the same mask pattern. Similar to the above, the second conductivity type diffusion layer for preventing formation of any channel at the surface portion of the semiconductor substrate and formation of any depletion layer can be formed effectively and extremely stably with the opened substrate exposing holes. Introduction of such impurities, if done by ion implantations, allows not only the second conductivity type diffusion layer but also the first conductivity type diffusion layer to be surrounded by the first conductivity type diffusion layer to be readily formed. In this case, as well as the above, the threshold voltage of the second semiconductor circuit element can be made higher by the ion implantations in which impurities are implanted with an angle of 10 degrees or more with respect to the perpendicular direction of the major surface of the semiconductor substrate.

Other objects and features of the invention will appear in the course of the description thereof, which follows.

BRIEF DESCRIPTION OF THE DRAWINGS

Additional objects and advantages of the present invention will be more readily apparent from the following detailed description of preferred embodiments thereof when taken together with the accompanying drawings in which:

FIG. 1 is a cross-sectional view showing a semiconductor integrated circuit device according to a first preferred embodiment of the invention;

DETAILED DESCRIPTION OF THE PRESENTLY PREFERRED EXEMPLARY EMBODIMENTS

Figure 7:
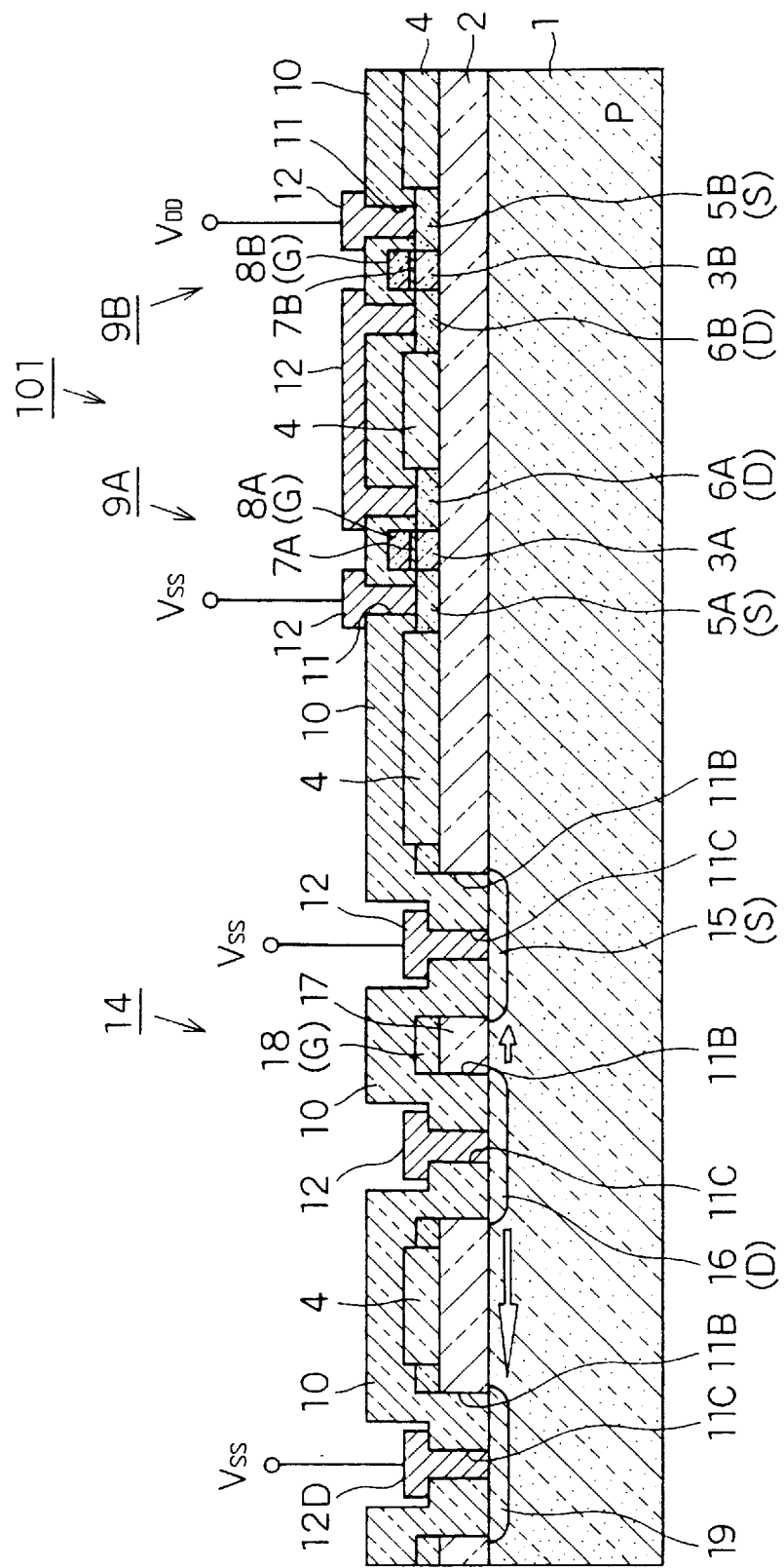
FIG. 7 is a cross-sectional view showing a structure of a conventional SOI semiconductor integrated circuit device.

FIG. 1 shows a semiconductor integrated circuit device according to a first preferred embodiment of the present invention. The semiconductor integrated circuit device according to the first embodiment is a semiconductor integrated circuit device having an SOI structure, and is a device capable of suitably preventing occurrence of leak current flowing from a diffusion layer even when a semiconductor element having a pn-junction in a semiconductor substrate is formed together with the SOI structure. In the semiconductor integrated circuit device of this embodiment, a protection transistor formed to have a pn-junction in the semiconductor substrate protects a CMOS inverter circuit formed at an SOI layer in the same manner as shown in FIG. 7.

Referring now to FIG. 1, the overall structure of the semiconductor integrated circuit device according to the first embodiment is described. As shown in FIG. 1, in the semiconductor integrated circuit device according to the first embodiment, the semiconductor substrate 1 is made of p-type single-crystal silicon substrate, on which a buried insulating film 2 made of, e.g., $SiO_2$ is formed. Single-crystal silicon layers isolated in a fashion to form islands, or SOI layers 3 (3A and 3B) are formed on the buried insulating film 2, thereby realizing the SOI structure as a semiconductor integrated circuit device. An isolating insulating film 4 made of, e.g., $SiO_2$ is formed around the SOI layers 3A and 3B when necessary.

In the semiconductor integrated circuit device, an n-channel MOSFET 9A is constituted at the SOI layer 3A by a source region 5A and a drain region 6A, a gate insulating film 7A formed on the SOI layer 3A, and a gate electrode 8A made of, e.g., polysilicon on the gate insulating film 7A. Similarly, a p-channel MOSFET 9B is constituted at the SOI layer 3B by a source region 5B and a drain region 6B, a gate insulating film 7B on the SOI layer 3B, and a gate electrode 8B on the gate insulating film 7B.

Figure 8:
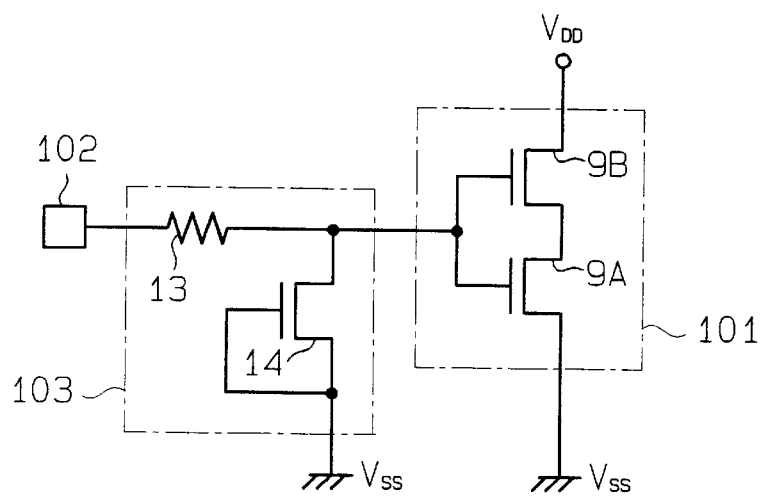
FIG. 8 is a circuit diagram showing an equivalent circuit of the semiconductor integrated circuit device shown in FIG. 7.

An interlayer insulating film 10 is formed on the SOI layers 3A and 3B and the isolating insulating film 4, interconnections 12 made of, e.g., aluminum (Al) alloy are formed to contact the source regions 5, the drain regions 6, and the gate electrodes 8 of the MOSFETs 9A, 9B, respectively, through contact holes 11 opened in the interlayer insulating film 10, though connecting portions of the gate electrode 8 are not shown. By the interconnections 12, the source region 5A of the n-channel MOSFET 9A is coupled to a ground line Vss whereas the source region 5B of the p-channel MOSFET 9B is coupled to a power supply line Vdd, thereby constituting, as well as the semiconductor integrated circuit device exemplified in FIG. 7, a CMOS inverter circuit 101 shown in FIG. 8.

On the other hand, a protection transistor 14 constituted by an n-channel MOSFET having a diffusion layer in the semiconductor substrate 1 is formed in the semiconductor integrated circuit device to protect the CMOS inverter circuit 101. The protection transistor 14 is also constituted, basically in the same manner as the semiconductor integrated circuit device exemplified in FIG. 7, of source and drain regions 15 and 16 made of an n-type diffusion layer formed in the p-type semiconductor substrate 1, a gate insulating film 17 formed on the semiconductor substrate 1, and a gate electrode 18 formed on the gate insulating film 17. The gate insulating film 17 constitutes a part of the buried insulating film 2, and the gate electrode 18 constitutes a part of the SOI layer 3.

With the semiconductor integrated circuit device according to this embodiment, diffusion layers 20 and 21 made of p-type material, the same conductivity type as the semiconductor substrate 1, are newly formed with respect to the protection transistor 14 thus constituted. Those p-type diffusion layers 20 and 21 surround the source and drain regions 15, 16, respectively, which are made of the n-type diffusion layers. That is, the p-type semiconductor substrate 1 is electrically in contact with the source and drain regions 15 and 16, respectively, made of the n-type diffusion layers through the p-type diffusion layers 20 and 21. Arsenic as an n-type impurity is introduced with concentration of, e.g., $1 \times 10^{19}$ to $1 \times 10^{22}$ cm$^{-3}$ into the source and drain regions 15 and 16 made of the n-type diffusion layers. Further, boron as a p-type impurity is introduced with concentration of, e.g., $1 \times 10^{14}$ to $1 \times 10^{17}$ cm$^{-3}$ into the semiconductor substrate 1 and with higher concentration of, e.g., $1 \times 10^{15}$ to $1 \times 10^{18}$ cm$^{-3}$ into the p-type diffusion layers 20 and 21.

In the protection transistor 14, interconnections 12 made of, e.g., aluminum alloy are also connected to the source and drain regions 15 and 16 through contact holes 11C. The contact holes 11C are formed to pass through the interlayer insulating film 10, which was deposited to bury the substrate contact holes 11B, which was formed to open the buried insulating film 2 (the gate insulating film 17) and the SOI layers 3 (the gate electrode 18). An interconnection 12, though not shown, is also connected to the gate electrode 18 through the contact hole 11C formed to pass through the interlayer insulating film 10. The interconnection 12 serving as an input is coupled to the drain region 16 of the protection transistor 14. The interconnection 12 is connected through the protection resistor 13 to a pad or pads for being wired with an external system.

Moreover, in the semiconductor integrated circuit device shown in FIG. 1, a highly doped p-type diffusion layer 19 is formed in the p-type semiconductor substrate 1 to electrically connect to interconnection 12D of the semiconductor substrate 1. In the semiconductor integrated circuit device of the embodiment, in addition, p-type diffusion layers 22 are newly provided to surround the p-type diffusion layer 19. More specifically, boron as a p-type impurity is introduced with a concentration of, e.g., $1 \times 10^{20}$ to $1 \times 10^{22}$ cm$^{-3}$ into the p-type diffusion layer 19 and with a concentration of, e.g., $1 \times 10^{15}$ to $1 \times 10^{18}$ cm$^{-3}$ into the p-type diffusion layer 22. The semiconductor substrate 1 is connected to, e.g., a ground line Vss through the p-type diffusion layers 22 and 19 and the interconnection 12D. Thus, the p-type diffusion layer may be considered as a current a discharging layer which permits transients on the Vss line to pass to the semiconductor substrate.

As described above, according to the device structure of the embodiment, at a surface of the p-type semiconductor substrate 1, the p-type semiconductor substrate 1 and a protection transistor (n-channel MOSFET) 14 are electrically in contact with each other through the p-type diffusion layers 20 and 21 which are more highly doped than the semiconductor substrate 1. That is, any route of leak current along the vicinity of the interface between the semiconductor substrate 1 and the buried insulating film 2 (gate insulating film 17) is surely cut off by the p-type diffusion layers 20 and 21 in which no channel is formed and even in which formation of a depletion layer is suppressed. Therefore, even if a positive voltage with respect to the semiconductor substrate 1 is applied to the drain region 16 made of the n-type diffusion layer, occurrence of leak current described above is suitably suppressed between the drain region 16 and the source region 15 or the p-type diffusion layer 19. The semiconductor integrated circuit device according to this embodiment, as a semiconductor integrated circuit device formed together with a semiconductor element having a pn-junction in the semiconductor substrate, operates with extremely excellent effects.

The source region 15 of the protection transistor 14 is maintained at the ground voltage by being connected to the ground line Vss, and a voltage in accordance with a voltage received at the bonding pad 102 (see FIG. 8) is actually applied to the pn-junction portion between the drain region 16 of the protection transistor 14 and the semiconductor substrate 1. That is, with this structure, the drain region 16 only is required to suppress occurrence of leak current, and would be operational if the p-type diffusion layer 21 is formed to surround the n-type diffusion layer forming the drain region 16.

Figure 2A:
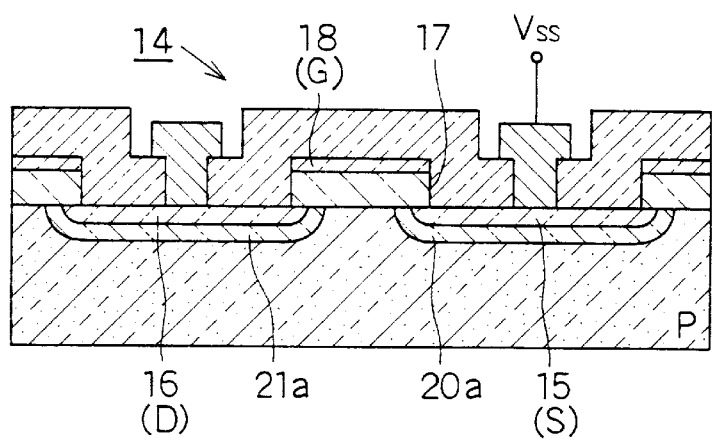
FIGS. 2A–2C are cross-sectional views showing modifications of the first embodiment.
Figure 2B:
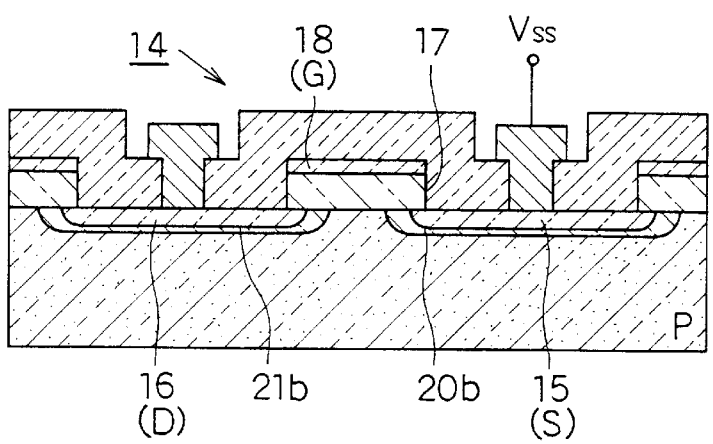
Figure 2C:
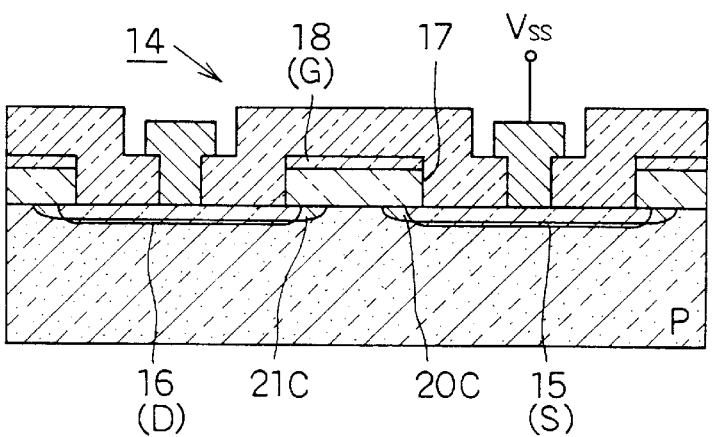

To cut off such a route of leak current, at least the p-type diffusion layer 21 more highly doped than the semiconductor substrate 1 is formed at a position around the interface of the semiconductor substrate 1 to the buried insulating film 2 (gate insulating film 17). FIGS. 2A to 2C show modifications of the embodiment by enlarging only the modified portions.

That is, although as shown in FIG. 2A a p-type diffusion layer 21a can be formed as a matter of course to surround the n-type diffusion layer forming the drain region 16, a p-type diffusion layer 21c can otherwise be formed to form a p-type region only around the interface described above, or only at the surface of the semiconductor substrate 1 as shown in FIG. 2C. As an intermediate structure of both, as shown in FIG. 2B, a p-type diffusion layer 21b can be formed so that the p-type region extends laterally. Any route of leak current can be surely cut off regardless the choice of any structure among them.

Next, collectively referring to FIGS. 3A to 3F, an example of a manufacturing method for the semiconductor integrated circuit device according to this embodiment is described.

Figure 3A:
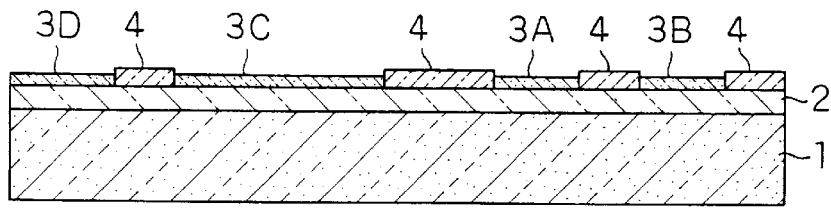
FIGS. 3A–3F are cross-sectional views showing a manufacturing process of the semiconductor integrated circuit device of the first embodiment.

To manufacture the semiconductor integrated circuit device, first, an SOI substrate is prepared in which a buried insulating film 2 made of SiO$_2$ and an SOI layer 3 made of a single-crystal silicon layer are overlaid on a semiconductor substrate 1 made of p-type single-crystal silicon by a known method such as the SIMOX method. Then, SOI layers 3A to 3D isolated in the form of respective islands by an isolation insulating film 4 are formed on the prepared SOI substrate as shown in FIG. 3A by an ordinary LOCOS isolation method.

Figure 3B:
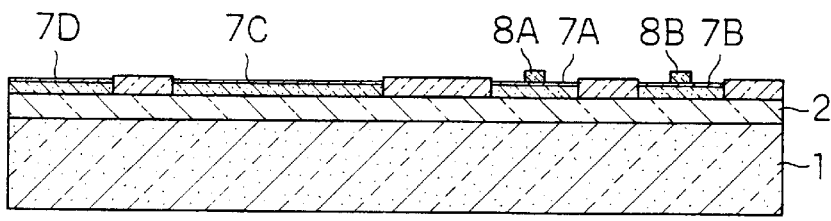

As shown in FIG. 3B, subsequently, gate oxide films 7A to 7D are formed on the surfaces of the SOI layers 3A to 3D thus formed by a thermal oxidation method. A polysilicon film (not shown) is then deposited by a CVD method on the entire surface of the substrate, and gate electrodes 8A and 8B are formed on the SOI layers 3A and 3B by a photolithographic method in a form shown in FIG. 3B. When necessary, the following steps may be added: impurities may be ion-implanted to form lightly doped diffusion layers (not shown) as field buffer layers at portions where n-channel and p-channel MOSFETs are to be placed; after this step, side wall insulators (not shown) may be formed at the side walls of the gate electrodes by isotropic etching where an $SiO_2$ film is deposited on the entire surface of the substrate by a CVD method.

Figure 3C:
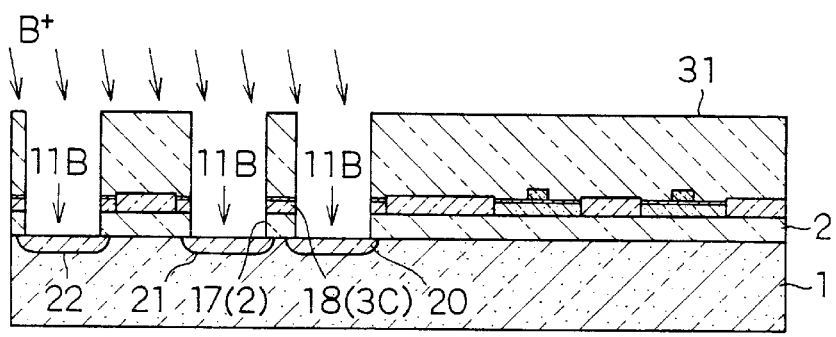

A photoresist 31 coated in a suitable manner is used as a mask in a photolithographic method as shown in FIG. 3C. When using the patterned photoresist 31 as a mask, the buried insulating film 2 and the SOI layers 3C and 3D are dry-etched to expose the surface of the semiconductor substrate 1 by opening substrate contact holes 11B reaching the semiconductor substrate 1. After the surface of the semiconductor substrate 1 is exposed, boron as a p-type impurity is ion-implanted using the same photoresist 31 continuously as the mask in a self-aligned manner. Portions serving as p-type diffusion layers 20 to 22 are formed in a manner shown in FIG. 3C. Although ions are ordinarily implanted with an angle of about 7 degrees to the perpendicular direction of the major surface of the semiconductor substrate 1 to suppress channeling in the crystal lattice of the semiconductor substrate, the ions here are implanted with an angle of 10 degrees or more (preferably about 45 degrees) with respect to the perpendicular direction of the major surface of the semiconductor substrate 1 in this manufacturing method.

More specifically, a larger implantation angle would be preferable. As the angle is made larger, the threshold voltage of the protection transistor 14 can be made higher even if the amount of implanted ions calculated on the area basis at a face parallel to the surface of the semiconductor substrate 1 is the same. This is because the amount of impurities obliquely implanted into the semiconductor substrate 1 from the side walls of the buried insulating film 2 is increased as the implantation angle becomes larger, thereby making the impurity concentration of the p-type diffusion layers 20 and 21 immediately below the gate insulating film 17 higher, which is determinative for the threshold voltage of the protection transistor 14. In other words, this means that the threshold voltage of the protection transistor 14 can effectively be made higher with the implantation of fewer ions. Thus, diffusion layers made in this way may be considered as layers for preventing lowering of the threshold value of the protection transistor, which would otherwise occur.

On the other hand, making the ion implantation angle larger also makes the threshold voltage of the protection transistor higher while the p-type impurity concentration of the p-type impurity diffusion layer 20 and 21 immediately below the source and drain regions 15 and 16 is kept low. A depletion layer can be formed with a narrower width when a reverse bias is applied between the drain region 16 and the semiconductor substrate 1, thereby reducing the parasitic capacity therebetween. As a result, the S value of the protection transistor 14 in a sub-threshold range is reduced, thereby reducing the off-current of the protection transistor 14 or the drain current at the time that the gate voltage is zero volts, even if the threshold voltage of the protection transistor 14 is the same.

The structures as shown in FIGS. 2A to 2C are preferably realized by arranging, e.g., the ion implantation angle when ions are implanted, other ion implantation conditions, and thermal treatment conditions thereafter. The upper limitation of the ion implantation angle is determined in consideration of the implanted ion's shadowing effect, which depends on the aspect ratio of the opening of the ion implanted region, or the ratio of the width of the substrate contact hole 11B to the depth of the opening mainly determined by the thickness of the photoresist 31, so as to be in a range that no shadowing effect is affected. As described above, when boron as a p-type impurity is introduced with concentration of, e.g., $1 \times 10^{14}$ to $1 \times 10^{17}$ cm$^{-3}$ into the semiconductor substrate 1, boron is introduced with concentration of, e.g., $1 \times 10^{15}$ to $1 \times 10^{18}$ cm$^{-3}$ through this ion implantation.

Figure 3D:
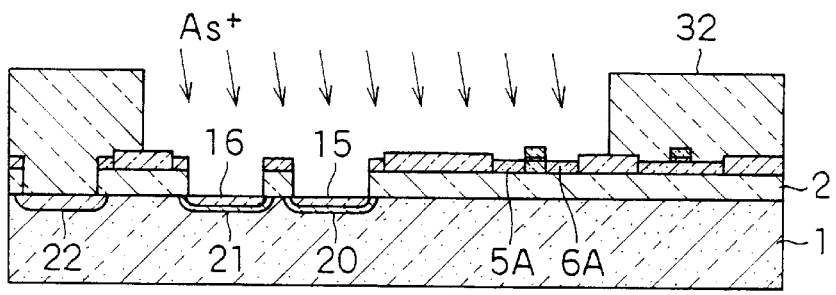
Figure 3E:
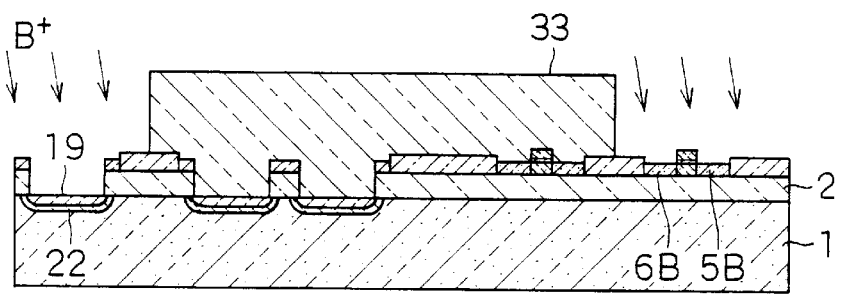
Figure 3F:
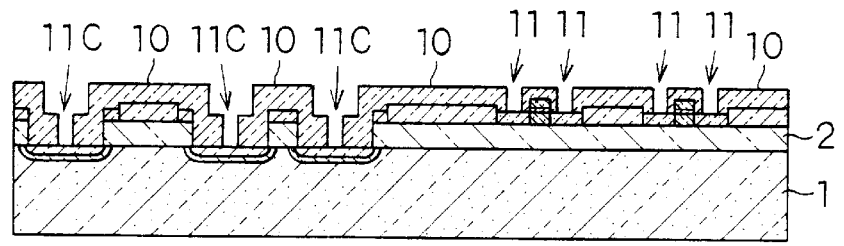

In this manufacturing method, if necessary, a photoresist 32 is subsequently formed into a pattern in a manner shown in FIG. 3D after formation of an oxide film of about 20 nanometers by a thermal oxidation on the exposed silicon surface. Then, arsenic as an n-type impurity is implanted using the patterned photoresist 32 as a mask to form the source and drain regions 5A and 6A of the n-channel MOSFET 9A and the source and drain regions 15 and 16 of the protection transistor 14. The photoresist 32 is then removed upon finishing the ion implantation of arsenic, and another photoresist 33 is formed into a pattern in a manner shown in FIG. 3E. Then, boron as p-type impurity is implanted using the patterned photoresist 33 as a mask to form the source and drain regions 5B, 6B of the n-channel MOSFET 9B and the p-type diffusion layer 19 as a diffusion layer for substrate connection.

When those ion implantation steps are finished, diffusion layers are formed by activating impurities implanted respectively through a reflowing thermal treatment after a BPSG film as an interlayer insulating film 10 is deposited over the entire surface of the substrate by a CVD method. Then, contact holes 11 and 11C are opened in a manner shown in FIG. 3F by a photolithographic method. After the contact holes 11 and 11C are opened, an aluminum (Al) alloy film is deposited on the entire surface by a sputtering method, and the film is subsequently formed into interconnections 12 and 12D through a photolithographic method to implement the structure shown in FIG. 1.

According to the manufacturing method for the semiconductor integrated circuit device according to this embodiment, a semiconductor integrated circuit device having an excellent structure can be stably and effectively formed. More specifically, a structure capable of suitably suppressing occurrence of leak current can be provided extremely stably and effectively. In particular, it is very important for the p-type diffusion layers 20, 21 to be formed at a precise size to surround the source and drain regions 15 and 16 formed as the n-type diffusion layers of the protection transistor 14. As described as the step shown in FIG. 3C, by using a method in which, after the substrate contact hole 11B reaching the semiconductor substrate 1 is opened, boron is implanted to form the p-type diffusion layers 20 to 22 in a self-aligned manner with the identical mask, the mask alignment to the portions becomes unnecessary, thereby ensuring the required precision can be realized.

In the manufacturing method, the steps of implanting ions to form lightly doped diffusion layers and forming the side wall insulating film are to be added when necessary, after the steps shown in FIG. 3, or after the gate electrodes 8A, 8B are formed on the SOI layers 3A, 3B. Those steps, however, can be implemented after opening of the substrate contact holes 11B shown in FIG. 3C. In such a case, the lightly doped diffusion layers are formed in the semiconductor substrate 1, and the side wall insulating film is formed on the side walls of the substrate contact hole 11B. As described above, ion implantation is implemented to form the p-type diffusion layers 20 to 22 using the same photoresist 31 as a mask during the step in FIG. 3C in this manufacturing method. Those ion implantations, however, can be conducted at the same time when ions are implanted to form the p-type lightly doped diffusion layers as the field buffer layers of the p-channel MOSFET 9B to the corresponding regions during the above-mentioned step.

Figure 4A:
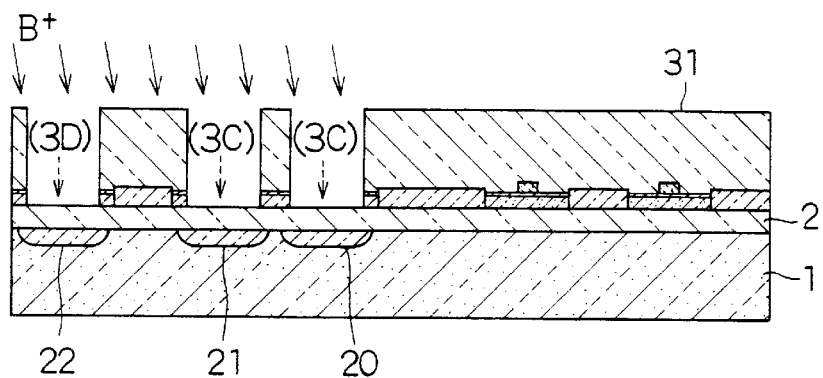
FIGS. 4A–4B are cross-sectional views showing modifications of the manufacturing process.
Figure 4B:
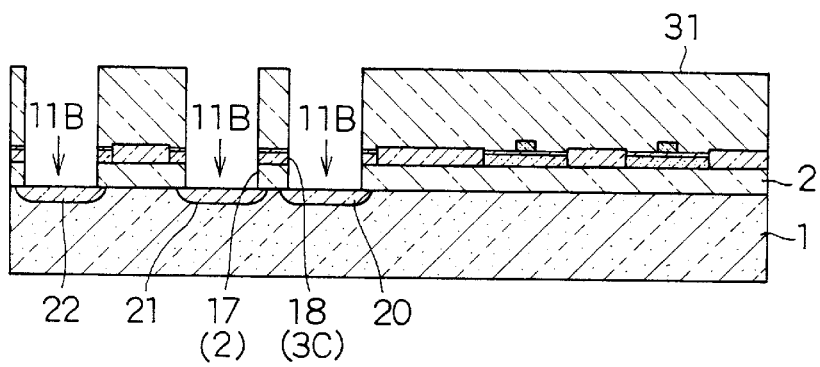

Moreover, the step shown in FIG. 3C can be embodied, by itself, by steps as illustrated in FIGS. 4A and 4B. That is, after the gate electrodes 8A and 8B are formed on the SOI layers 3A and 3B in a manner shown in FIG. 3B, a photoresist 31 is formed in a pattern as shown in FIG. 4A and is used as a mask to remove the SOI layers 3C and 3D by etching. Then, after boron as a p-type impurity is implanted using the same photoresist 31 as a mask, the buried insulating film 2 is dry-etched in a self-aligned fashion using the same photoresist 31 again as a mask in a manner shown in FIG. 4B, thereby opening the substrate contact hole 11B reaching the semiconductor substrate 1 to expose the surface of the semiconductor substrate 1. By adoption of such steps, boron can be implanted while the surface of the semiconductor substrate 1 is covered by the buried insulating film 2 so that the leakage at pn-junctions due to mixture of impurities during the ion implantations can be suppressed.

Regarding this method, otherwise, a step can be employed in which boron is implanted after the photoresist 31 is formed into a pattern and then the SOI layers 3C and 3D and the buried insulating film 2 are continuously removed by etching in a self-aligned manner. By adoption of such a step, the leakage at pn-junctions due to mixture of impurities during the ion implantation can be suppressed. Although in the manufacturing method described above, the respective diffusion layers inclusive of the p-type diffusion layers are formed based on ion implantations, any other methods such as doping by thermal diffusion, laser, plasma or the like can be used as a matter of course as long as those diffusion layers can be properly formed. The ion implantation in fact can form the diffusion layers readily and properly.

Figure 5:
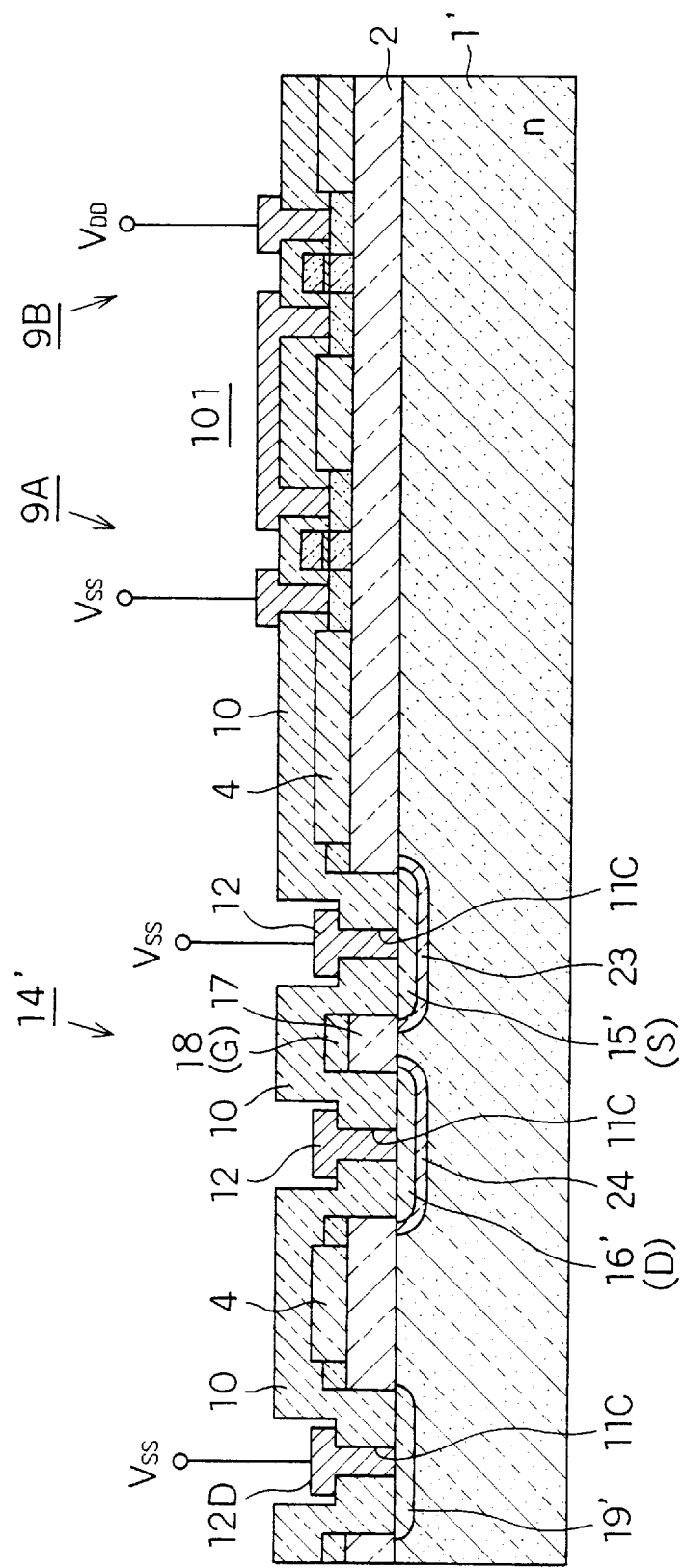
FIG. 5 is a cross-sectional view showing a semiconductor integrated circuit device according to a second preferred embodiment of the invention.

FIG. 5 shows a semiconductor integrated circuit device according to a second preferred embodiment of the present invention. The semiconductor integrated circuit device according to the second embodiment is also a semiconductor integrated circuit device having an SOI structure and is a device capable of suitably preventing occurrence of any leak current from the diffusion layers of the device even where a semiconductor element having a pn-junction in the semiconductor substrate is formed together with the SOI structure. The semiconductor integrated circuit device of this embodiment, as well as the semiconductor integrated circuit device of the first embodiment, basically protects a CMOS inverter circuit formed in the SOI layer by means of a protection transistor formed with a pn-junction in the semiconductor substrate but formed with the different conductivity in the semiconductor substrate and respective diffusion layers formed in the semiconductor substrate from the conductivity in the first embodiment.

Referring to FIG. 5, the essential structure of the semiconductor integrated circuit device according to the second embodiment of the invention is described. As shown in FIG. 5, in this semiconductor integrated circuit device, a semiconductor substrate 1U is made of an n-type single-crystal silicon substrate, on which a buried insulating film 2 made of, e.g., $SiO_2$ is formed. SOI layers isolated in a fashion to form islands are formed on the buried insulating film 2, thereby realizing the SOI structure as a semiconductor integrated circuit device. A CMOS inverter circuit 101 made of an n-channel MOSFET 9A and a p-channel MOSFET 9B is implemented in the SOI layers, as in the semiconductor integrated circuit device of the first embodiment.

On the other hand, a protection transistor 14' formed together with diffusion layers in the semiconductor substrate 1' to protect the CMOS inverter circuit 101 is formed to have source and drain regions 15' and 16' made of n-type highly doped diffusion layers of the same conductivity type as the semiconductor substrate 1'. The source and drain regions 15' and 16' of the protection transistor 14' are surrounded by p-type diffusion layers 23 and 24 of the opposite conductivity type to the semiconductor substrate 1'. In the protection transistor 14', interconnections 12 made of, e.g., aluminum alloy are connected to the source and drain regions 15' and 16' as well as the gate electrodes 18 through contact holes 11C, though the interconnection for the gate electrode 18 is not shown. A diffusion layer 19' for substrate connection to couple the semiconductor substrate 1' to an interconnection 12D is formed of an n-type highly doped diffusion layer of the same conductivity type as the semiconductor substrate 1'.

According to the semiconductor integrated circuit device thus constituted, the p-type diffusion layers 23 and 24 are in a form as inserted with the opposite conductivity to and among the source and drain regions 15' and 16' made of the n-type diffusion layer of the same conductivity type as the semiconductor substrate 1' and the diffusion layer 19' for substrate connection. That is, the source and drain regions 15' and 16' and the diffusion layer 19' for substrate connection are respectively isolated electrically by the p-type diffusion layers 15' and 16', thereby suitably suppressing occurrence of any leak current among the respective n-type diffusion layers 15', 16' and 19'.

It is to be noted that even in this semiconductor integrated circuit device according to the second embodiment, its manufacturing method is analogous to the manufacturing method of the semiconductor integrated circuit device described above based on FIGS. 3 and 4, and the description thereof is therefore omitted for simplicity.

In the first and second embodiments, the semiconductor element having a pn-junction in a semiconductor substrate in the semiconductor integrated circuit device having the SOI structure, formed together with the SOI structure, is an MOSFET. However, the semiconductor element need not be a MOSFET and can be a wide variety of elements.

Figure 6:
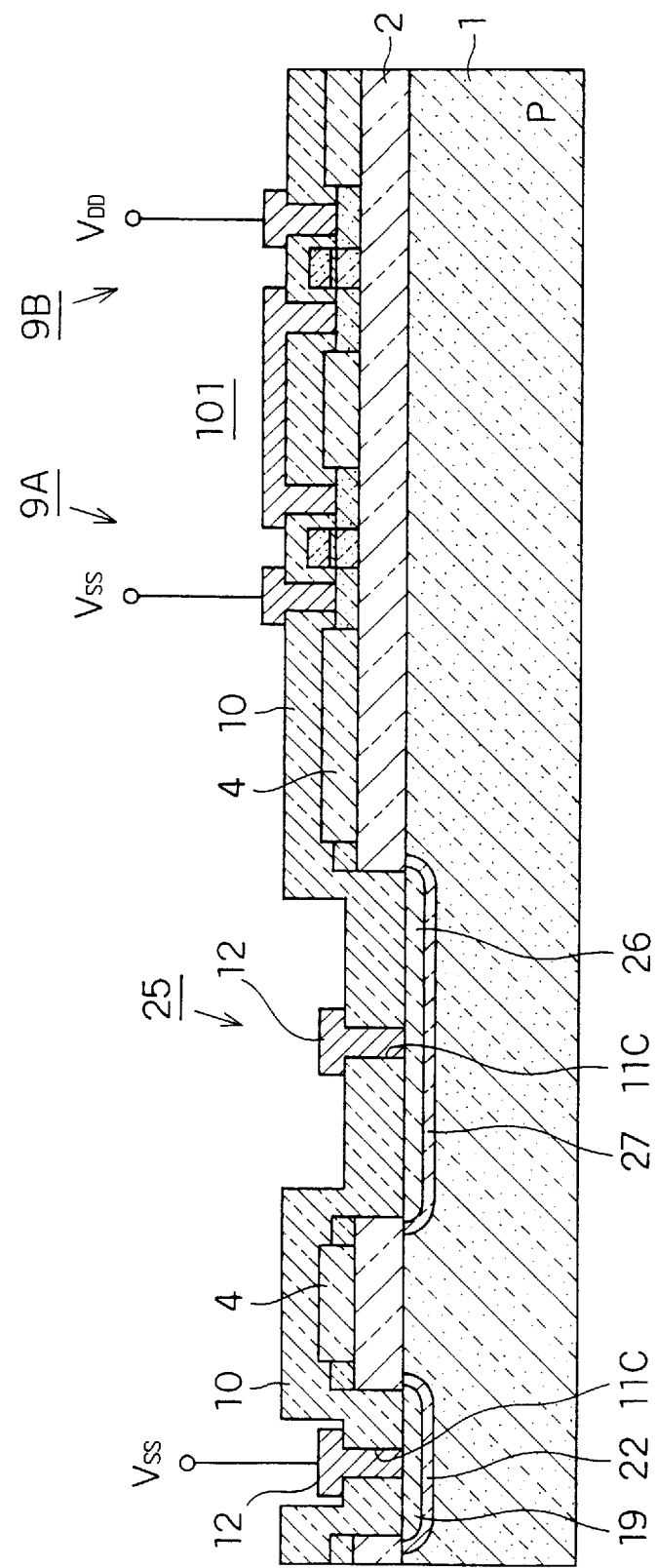
FIG. 6 is a cross-sectional view showing a semiconductor integrated circuit device according to a third preferred embodiment of the invention.

In FIG. 6, a structure with a diode as the semiconductor element formed along with a pn-junction in the semiconductor substrate is shown as a semiconductor integrated circuit device according to a third preferred embodiment of the invention. Referring to FIG. 6, the overall structure of the semiconductor integrated circuit device according the third embodiment is described. As shown in FIG. 6, in this semiconductor integrated circuit device, a semiconductor substrate 1 is made of a p-type single-crystal silicon substrate, on which a buried insulating film 2 made of, e.g., $SiO_2$ is formed. SOI layers isolated in a fashion to form islands are formed on the buried insulating film 2, thereby realizing the SOI structure as a semiconductor integrated circuit device. A CMOS inverter circuit 101 made of an n-channel MOSFET 9A and a p-channel MOSFET 9B is formed in the SOI layers, as in the semiconductor integrated circuit device of the first or second embodiment.

On the other hand, a diode 25 formed along with a diffusion layer in the p-type semiconductor substrate 1 has an n-type diffusion layer 26 of the opposite conductivity type to the semiconductor substrate 1. The n-type diffusion layer 26 of the diode 25 is surrounded by the p-type diffusion layer 27 of the same conductivity type as the semiconductor substrate 1. That is, the p-type semiconductor substrate 1 and the n-type diffusion layer 26 of the diode 25 are electrically in contact with each other through the p-type diffusion layer 27. The impurity concentration in the p-type diffusion layer 27 is set at a higher concentration than the impurity concentration of the semiconductor substrate 1. More specifically, arsenic of as an n-type impurity is introduced with concentration of, e.g., $1\times10^{19}$ to $1\times10^{22}$ cm$^{-3}$ into the n-type diffusion layer 26. On the other hand, boron as a p-type impurity is introduced with concentration of, e.g., $1\times10^{14}$ to $1\times10^{17}$ cm$^{-3}$ into the semiconductor substrate 1 and with a higher concentration of, e.g., $1\times10^{15}$ to $1\times10^{18}$ cm$^{-3}$ into the p-type diffusion layer 27.

In the diode 25, the n-type diffusion layer 26 is connected to an interconnection 12 made of, e.g., aluminum alloy through a contact hole 11C. Even in the semiconductor integrated circuit device, a highly doped p-type diffusion layer 19, as in the semiconductor integrated circuit device of the first embodiment, is formed as a diffusion layer for substrate connection for connecting the semiconductor substrate 1 to an interconnection 12D, and a p-type diffusion layer 22, made of the same conductivity as the diffusion layer 19, surrounds the p-type diffusion layer 19. Specifically, boron as a p-type impurity is introduced with concentration of, e.g., $1\times10^{20}$ to $1\times10^{22}$ cm$^{-3}$ into the p-type diffusion layer 19 and with concentration of, e.g., $1\times10^{15}$ to $1\times10^{18}$ cm$^{-3}$ into the p-type diffusion layer 22.

The p-type diffusion layer 27 suitably cuts off any route of leak current even in the semiconductor integrated circuit device thus constituted according to the third embodiment, thereby suppressing occurrence of the leak current. It is to be noted that even in the semiconductor integrated circuit device according to the third embodiment, when the conductivity type of the semiconductor substrate and the respective diffusion layers formed in the semiconductor substrate are constituted differently, the structure would be analogous to the semiconductor integrated circuit device according to the second embodiment. Moreover, the semiconductor integrated circuit device according to the third embodiment can be manufactured in a manner analogous to the manufacturing method for the semiconductor integrated circuit device according to the first embodiment described with reference to FIGS. 3, 4.

Meanwhile, in the first to third embodiments above, the semiconductor element having a pn-junction in the semiconductor substrate is a circuit element for protecting a semiconductor integrated circuit element having the SOI structure. However, the semiconductor element having a pn-junction in the semiconductor substrate is not limited to the protection circuit element and can be any other circuit element as a matter of course. The semiconductor element having a pn-junction in the semiconductor substrate can be used to discharge to the semiconductor substrate a surge voltage fed to the semiconductor integrated circuit having an SOI structure.

The foregoing description of a preferred embodiment of the invention has been presented for purposes of illustration and description, and is not intended to be exhaustive or to limit the invention to the precise form disclosed. The description was selected to best explain the principles of the invention and their practical application to enable others skilled in the art to best utilize the invention in various embodiments and various modifications as are suited to the particular use contemplated. It is intended that the scope of the invention not to be limited by the specification, but be defined by the claims set forth below.

What is claimed is:

1. A semiconductor integrated circuit device comprising:
   a semiconductor substrate of a first conductivity type;
   an insulating layer formed on a surface of the semiconductor substrate;
   a semiconductor layer formed on the insulating layer;
   a first semiconductor circuit element formed at the semiconductor layer;
   a second semiconductor circuit element formed with a second conductivity type diffusion layer, different from the first conductivity type, in the semiconductor substrate;
   wherein said second conductivity type diffusion layer is electrically connected to said first semiconductor circuit element;
   wherein the second conductivity type diffusion layer is surrounded at least on a surface coplanar with the surface of the semiconductor substrate by a first conductivity type diffusion layer doped more highly than a portion of the semiconductor substrate proximate thereto;
   at least a portion of the first conductivity type diffusion layer faces the insulating layer directly thereunder; and
   said first conductivity type diffusion layer prevents leak current flow between said second conductivity type diffusion layer at said semiconductor substrate surface and said semiconductor substrate.

2. The semiconductor integrated circuit device according to claim 1, wherein surfaces of said second conductivity type diffusion layer exclusive of said surface coplanar with said surface of said semiconductor substrate are contacted by said first conductivity type diffusion layer.

3. The semiconductor integrated circuit device according to claim 1, wherein the second semiconductor circuit element is a MOSFET, at least one of a source and drain region of which is formed by the second conductivity type diffusion layer.

4. The semiconductor integrated circuit device according to claim 1, wherein the second semiconductor circuit element is a diode in which the first conductivity type diffusion layer and the second conductivity type diffusion layer constitute a pn-junction.

5. A semiconductor integrated circuit device comprising:
   a semiconductor substrate of a first conductivity type;
   an insulating layer formed on the semiconductor substrate;
   a semiconductor layer formed on the insulating layer;
   a first semiconductor circuit element formed at the semiconductor layer;
   a second semiconductor circuit element formed with a first conductivity type diffusion layer in the semiconductor substrate;
   wherein said first conductivity type diffusion layer is electrically connected to said first semiconductor circuit element;

the first conductivity type diffusion layer is surrounded by a second conductivity type diffusion layer, different from the first conductivity type, in the second semiconductor circuit element;

said second conductivity type diffusion layer prevents leak current flow between said first conductivity type diffusion layer at said semiconductor substrate surface and said semiconductor substrate; and at least a portion of the second conductivity type diffusion layer faces the insulating layer directly thereunder.

6. The semiconductor integrated circuit device according to claim 5, wherein the second semiconductor circuit element is a MOSFET, at least one of a source and drain region of which is formed by the diffusion layer of the first conductivity type.

7. The semiconductor integrated circuit device according to claim 5, wherein the second semiconductor circuit element is a diode in which the first conductivity type diffusion layer and the second conductivity type diffusion layer constitute a pn-junction.

8. The semiconductor integrated circuit device according to claim 5, wherein the second semiconductor circuit element is a protection circuit element for protecting the first semiconductor circuit element by electrically connecting to the first semiconductor circuit element.

9. A semiconductor integrated circuit device comprising:
a semiconductor substrate;
an insulating layer formed on the semiconductor substrate;
a semiconductor layer formed on a surface of the insulating layer;
a first semiconductor circuit element formed at the semiconductor layer;
a second semiconductor circuit element formed with a diffusion layer in the semiconductor substrate and electrically connected to the first semiconductor circuit element;
a leak current suppressing layer formed at a surface of the semiconductor substrate to reduce leak current flowing from the diffusion layer of the second semiconductor circuit element to the semiconductor substrate; and
a current discharging layer, at a surface of the diffusion layer of the second semiconductor circuit element coplanar with the surface of the semiconductor substrate, for permitting current to flow from the diffusion layer through the semiconductor substrate;
wherein said diffusion layer is electrically connected to said first semiconductor element;
said leak current suppressing layer is formed between the diffusion layer and the current discharging layer to prevent leak current flow between said diffusion layer and said semiconductor substrate; and
at least a portion of the leak current suppressing layer faces the insulating layer directly thereunder.

10. A semiconductor integrated circuit device comprising:
a semiconductor substrate;
an insulating layer formed on the semiconductor substrate;
a semiconductor layer formed on the insulating layer;
a first semiconductor circuit element formed at the semiconductor layer and having an input for receiving a signal; and
a second semiconductor circuit element formed in the semiconductor substrate and electrically connected to the input for preventing surge voltage from reaching the first semiconductor circuit element, said second semiconductor circuit element having
a diffusion layer formed at a surface of the semiconductor substrate and being electrically connected to the semiconductor substrate and being electrically connected to the input,
a current discharging layer for permitting surge current to flow from the diffusion layer through the semiconductor substrate, and
a leak current suppressing layer formed between the diffusion layer and the current discharging layer and at a surface of the semiconductor substrate and at a surface of the diffusion layer to reduce leak current flowing from the diffusion layer to the current discharging layer when the surge voltage is not present;
wherein said diffusion layer is electrically connected to said first semiconductor circuit element so that current flowing through said first semiconductor element flows through said diffusion layer;
the leak current suppressing layer is of the same conductivity type as the semiconductor substrate and is made of a layer more highly doped than a portion of the semiconductor substrate proximate thereto and is for preventing current flow between said diffusion layer and said semiconductor substrate; and
at least a portion of the leak current suppressing layer faces the insulating layer directly thereunder and directly under the gate layer.

11. A semiconductor integrated circuit device comprising:
a semiconductor substrate having an insulating layer formed directly thereon, an impurity concentration of said semiconductor substrate at an interface with said insulating layer being lower than at other portions of said semiconductor substrate;
a semiconductor layer formed on the insulating layer;
a first semiconductor circuit element formed at the semiconductor layer having an input for receiving a signal; and
a second semiconductor circuit element formed in the semiconductor substrate and electrically connected to the input for preventing surge voltage from reaching the first semiconductor circuit element, said second semiconductor circuit element having
a diffusion layer formed at a surface of the semiconductor substrate and electrically connected to the input,
a protection transistor including a current discharging layer for permitting surge current to flow from the diffusion layer through the semiconductor substrate, and
a threshold value lowering preventive layer of the same conductivity type as the semiconductor substrate and more highly doped than a portion of the semiconductor substrate proximate thereto, formed between the diffusion layer and the current discharging layer and formed at the surface of the semiconductor substrate and formed at a surface of the diffusion layer for preventing the threshold value of the protection transistor from decreasing.

12. A semiconductor integrated circuit device comprising:
a semiconductor substrate of a first conductivity type;
an insulating layer formed on a surface of the semiconductor substrate;
a semiconductor layer formed on the insulating layer;

a first semiconductor circuit element formed at the semiconductor layer; and a second semiconductor circuit element formed with a second conductivity type diffusion layer, different from the first conductivity type, in the semiconductor substrate;

wherein an impurity concentration of said semiconductor substrate at an interface with said insulating layer is lower than at other portions of said semiconductor substrate;

the second conductivity type diffusion layer is electrically connected to said first semiconductor circuit element, at least a part of said second conductivity type diffusion layer being formed below said insulating layer at a surface of said semiconductor substrate;

the second conductivity type diffusion layer is surrounded by a diffusion layer having a higher impurity concentration than said semiconductor substrate which compensates for said low impurity concentration of said semiconductor substrate at said interface with said insulating layer.

* * * * *